United States Patent
Reso

(10) Patent No.: US 11,695,033 B2
(45) Date of Patent: Jul. 4, 2023

(54) MICROELECTRONIC DEVICES

(71) Applicant: X-FAB Dresden GmbH & Co. KG, Dresden (DE)

(72) Inventor: Denis Reso, Radebeul (DE)

(73) Assignee: X-FAB DRESDEN GMBH & CO. KG, Dresden (DE)

( * ) Notice: Subject to any disclaimer, the term of this patent is extended or adjusted under 35 U.S.C. 154(b) by 59 days.

(21) Appl. No.: 17/186,034

(22) Filed: Feb. 26, 2021

(65) Prior Publication Data

US 2021/0273040 A1    Sep. 2, 2021

(30) Foreign Application Priority Data

Feb. 28, 2020 (GB) ...................................... 2002875

(51) Int. Cl.
*H01L 23/522* (2006.01)
*H01L 23/528* (2006.01)
*H01L 23/48* (2006.01)
*H01L 49/02* (2006.01)

(52) U.S. Cl.
CPC .......... *H01L 28/60* (2013.01); *H01L 23/5223* (2013.01)

(58) Field of Classification Search
CPC .................................................. H01L 23/5223
See application file for complete search history.

(56) References Cited

U.S. PATENT DOCUMENTS

| | | | |
|---|---|---|---|
| 7,176,082 B2 * | 2/2007 | Randazzo | H01L 23/5223 257/306 |
| 2014/0183698 A1 * | 7/2014 | Hsu | H01L 23/5223 257/532 |
| 2015/0214292 A1 | 7/2015 | Tao et al. | |
| 2017/0373187 A1 * | 12/2017 | Birner | H01L 23/5222 |
| 2019/0013269 A1 * | 1/2019 | Zhang | H01L 23/5223 |
| 2020/0066627 A1 * | 2/2020 | Do | H01L 23/5226 |
| 2021/0202382 A1 * | 7/2021 | Okina | H01L 23/5226 |

FOREIGN PATENT DOCUMENTS

JP    2004/109988    4/2004

OTHER PUBLICATIONS

UK Combined Search and Examination Report for corresponding Application No. GB2002875.9, dated Jul. 24, 2020, 6 pages.

* cited by examiner

*Primary Examiner* — Omar F Mojaddedi
(74) *Attorney, Agent, or Firm* — Dority & Manning, P.A.

(57) ABSTRACT

A microelectronic device comprises:
a first electrode;
a second electrode located vertically below said first electrode and separated by a dielectric material; and
a connection wire electrically connected to said second electrode;
wherein said first electrode comprises a notch located vertically above said connection wire.

17 Claims, 4 Drawing Sheets

MICROELECTRONIC DEVICES

TECHNICAL FIELD

The invention relates to microelectronic devices and in particular parallel electrode coupling devices such as galvanic isolation coupling devices.

BACKGROUND

Microelectronic devices such as capacitors and transformers that are used for chip-level galvanic isolation (GI) have to withstand high voltages to ensure proper functioning of the device. In such coupling devices, the highest strength of the electrical field occurs at the edges of the vertically stacked electrodes. Local high electric field strengths can lead to breakdown when a large voltage is applied across the device.

FIG. 1 shows a schematic diagram of a cross section of a microelectronic device having a top electrode a101 and a bottom electrode a102 located vertically below the top electrode. The bottom electrode a102 is located above a silicon substrate a106, and the top electrode a101 is covered by a passivation layer a107. Potential field lines between the electrodes a101 and 102 are shown. High electric field strengths occur at the edges a1010 and a1020 of the electrodes.

US20150214292 describes an isolation device having a substrate, a metal plate, a conductive layer, as well as first and second isolation layers. The conductive layer is formed within the substrate and is coupled to the metal plate to receive a capacitively coupled signal from the metal plate. The first and second isolation layers are sandwiched between the metal plate and the conductive layer.

SUMMARY

Aspects of the present invention provide microelectronic devices as set out in the appended claims.

Preferred embodiments are described below with reference to the accompanying drawings.

DETAILED DESCRIPTION

In a microelectronic device comprising two parallel electrodes, the electrical field can be balanced between the two electrodes by dimensioning of the respective electrode overlaps and protective field plates. However, high field strengths can still occur locally where a connection wire intersects the electrodes. The connection wire can cause an increased electrical field (spike) at the edge of the overlapping electrode. Embodiments described herein may mitigate this negative influence of the connection wire by a notch in the electrode overlapping the connection wire.

Figure 1:
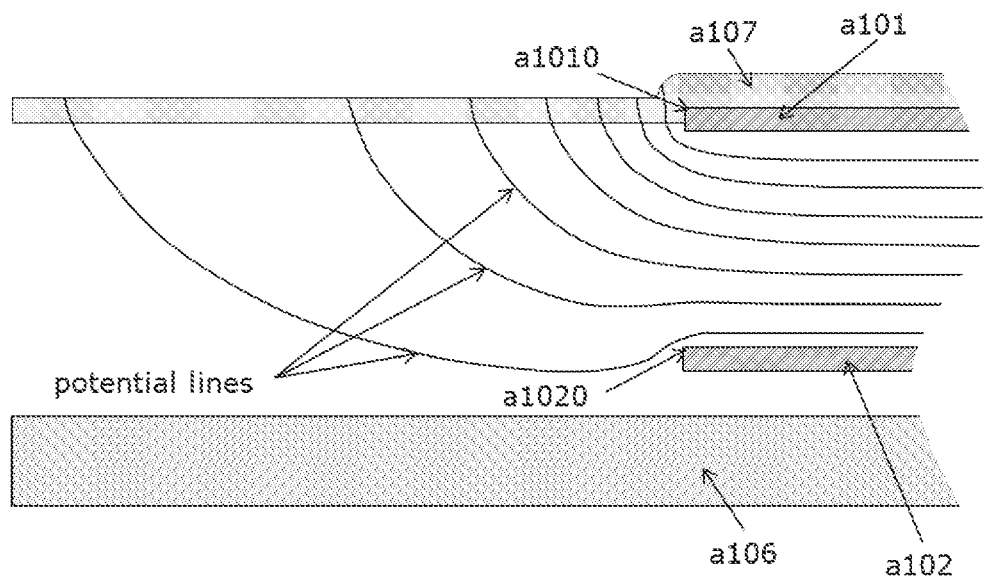
FIG. 1 shows a schematic cross-section of a parallel electrode coupling device.
Figure 2A:
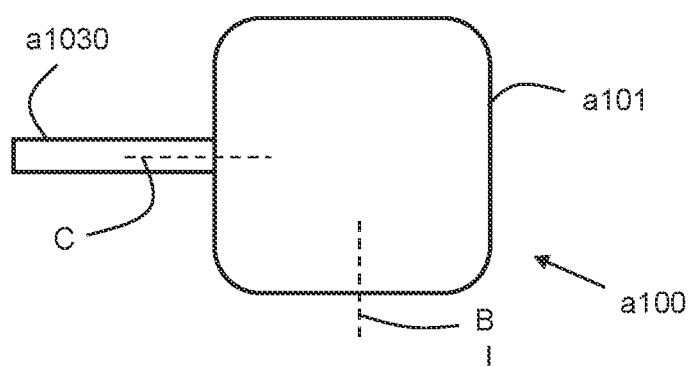
FIG. 2A shows a schematic top view of a microelectronic device without a notch.
Figure 2B:
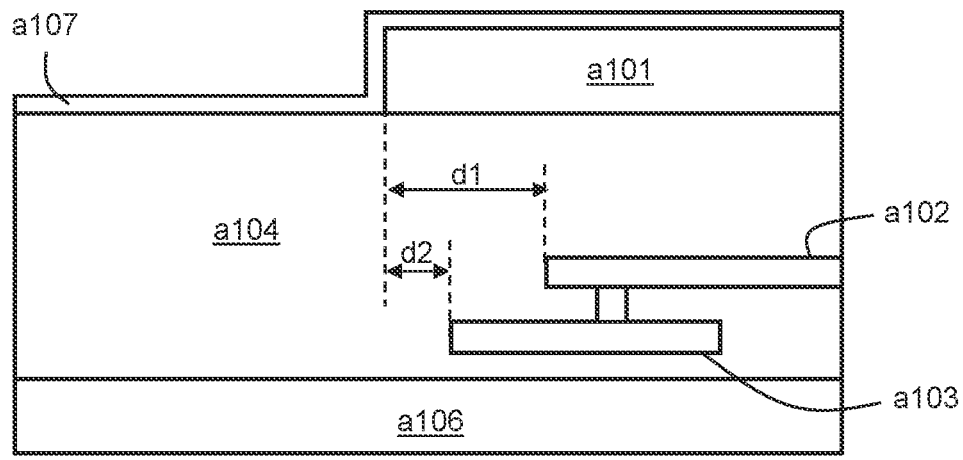
FIG. 2B shows a schematic cross-section of the microelectronic device.
Figure 2C:
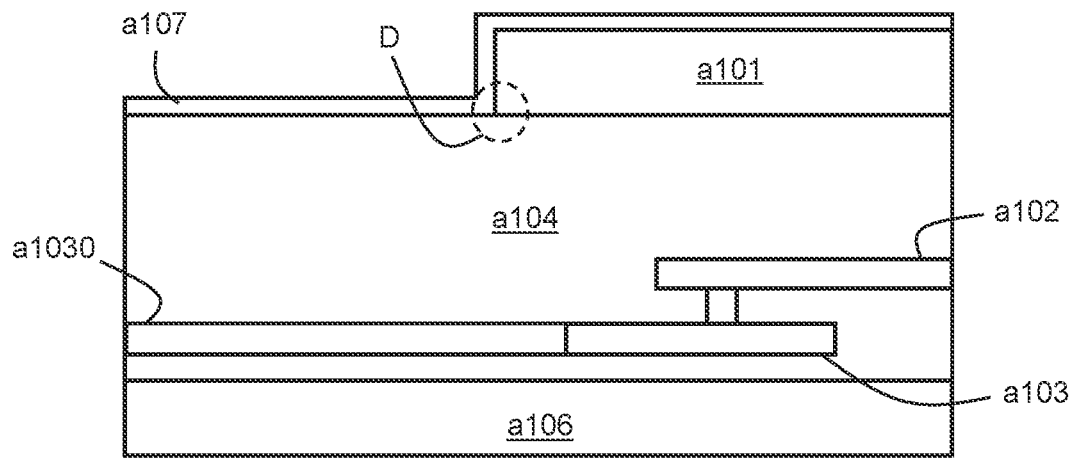
FIG. 2C shows another schematic cross-section of the microelectronic device.

FIGS. 2A to 2C illustrate a microelectronic device a100. Corresponding or equivalent features have been given the same reference numerals in different figures to aid understanding and are not intended to be limiting. The device a100 comprises electrodes a101 and a102 and field plate a103 properly dimensioned with overlaps d1 and d2 to balance the electric field between the electrodes, but without a notch in the top electrode a101. The connection wire a1030 effectively extends the field plate a103 laterally at the point of connection, which increases the electric field strength in the corresponding region of the edge of the top electrode a101.

FIG. 2A is a schematic top view of the device a100 having a top electrode a101 and connection wire a1030. Dashed lines B and C indicate the cross sections of the device a100 illustrated in FIGS. 2B and 2C respectively.

FIG. 2B shows a cross section of a part of the device a100 along the line B of FIG. 2A not including the connection wire a1030. The device a100 comprises top electrode a101 and bottom electrode a102 separated by dielectric material a104. The bottom electrode a102 is electrically connected to a field plate a103 located between the bottom electrode a102 and the underlying substrate a106. The top electrode a101 is covered by a protective passivation layer a107. To balance the electric field between the electrodes, the top electrode a101 extends beyond the bottom electrode a102 by a distance d1 and beyond the field plate a103 by a distance d2 in at least one lateral direction.

FIG. 2C shows a cross section of a part of the device a100 along the line C of FIG. 2A including the connection wire a1030. The connection wire a1030 is directly connected to the field plate a103 and electrically connected to the bottom electrode a102 by the field plate and vias. Typically, the connection wire a1030 is formed in the same metal layer of the back-end stack as the field plate a103 by depositing and patterning the metal layer. The top electrode a101 overlaps a part of the connection wire a1030, which can cause a spike in the electric field in a region D at the edge of the top electrode a101.

In order to remove or reduce the spike in the electric field, an embodiment comprises the device a100 illustrated in FIGS. 2A to 2C, but wherein the top electrode a101 comprises a notch that overlaps a part of the connection wire a1030.

Figure 3:
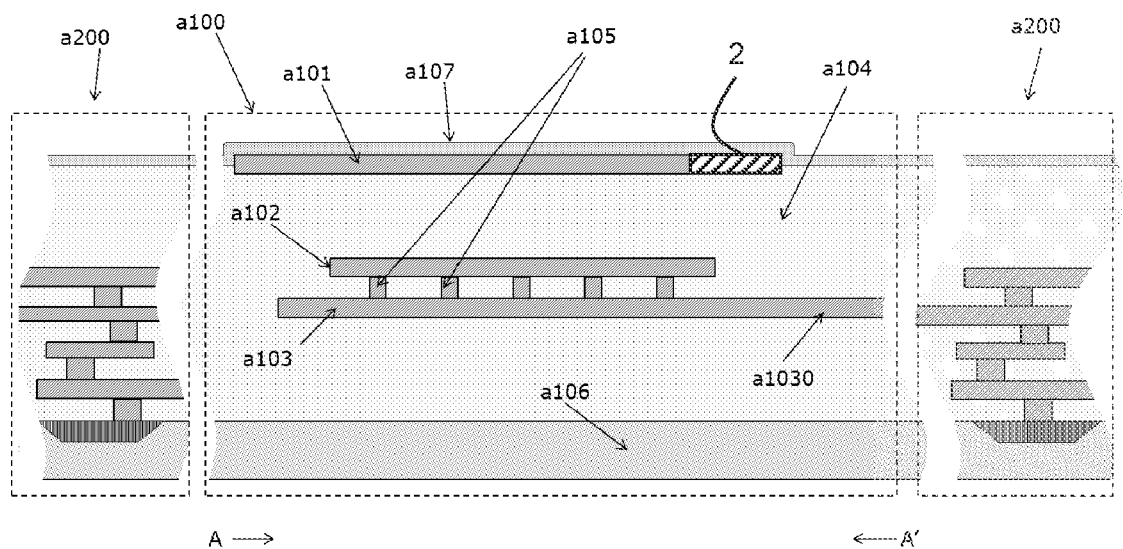
FIG. 3 shows a schematic cross-section of a microelectronic device according to an embodiment.

FIG. 3 shows a schematic diagram of a cross section of a microelectronic device a100 being a parallel electrode coupling device according to an embodiment. The device a100 comprises a first electrode a101 and a second electrode a102 coupled to the first electrode a101. The electrodes a101 and a102 are centrally aligned, with the second electrode a102 located vertically below the first electrode a101 and separated by a dielectric material a104. The second electrode a102 is connected to a field plate a103 by vias a105. A connection wire a1030 is directly connected to the field plate a103. The connection wire a1030 is located in the same plane as the field plate a103. A passivation layer a107 covers and protects the first electrode a101. Peripheral structures a200 with metal layers, inter-metal dielectric layers and vias provide connections to other devices (not shown) and to the substrate a106. To balance the electric field between the electrodes a101 and a102, the first electrode a101 extends laterally beyond the field plate a103, while the field plate a103 extends laterally beyond the second electrode a102.

The device a100 is manufactured as a part of the metal interconnection of an integrated circuit within the back-end of line (BEOL) process. The metal interconnection is manufactured in a layer-by-layer technique such that some of the lower metal layers (including the metal layer comprising the second electrode a102) in the stack are buried below the dielectric material a104 and cannot be accessed directly from the outside by wire-bonding or equivalent techniques. To access these lower metal layers, the corresponding areas must be connected laterally by wires (e.g. the connection wire a1030) and vertically by vias (e.g. vias a105 between the electrode a102 and the field plate a103). However, the connection wire a1030 effectively extends the lateral extent of the field plate a103, and would thereby increase the electric field strength locally at the edge of the first electrode a101 where it overlaps the wire a1030. To at least partly solve this problem, the first electrode a101 comprises a notch 2 located vertically above (i.e. overlapping) the connection wire a1030.

Figure 4:
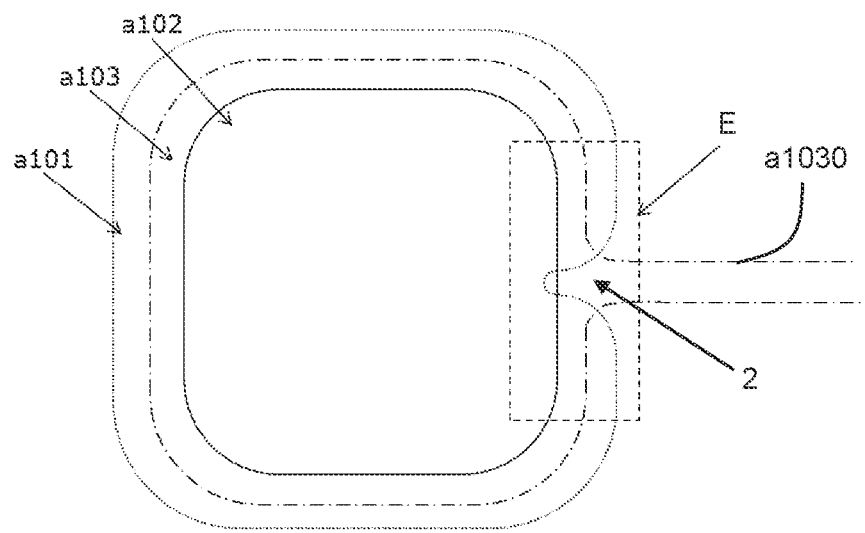
FIG. 4 shows a schematic top view of a microelectronic device according to an embodiment.

FIG. 4 shows a schematic top view of a microelectronic device a100 according to an embodiment. The device a100 comprises a first electrode a101, a second electrode a102 and a field plate a103. A connection wire a1030 is directly connected to the field plate a103. The first electrode a101 comprises a notch 2 located vertically above the connection wire a1030 in a region E. The notch 2 has a depth such that the notch extends over both a part of the field plate a103 and a part of the second electrode a102. In other embodiments, the notch 2 may only extend over a part of the field plate a103 and not over the bottom electrode a102. The first and second electrodes a101 and a102 have rectangular shapes with rounded corners. The shape of the first electrode a101 is larger than the shape of the second electrode a102, such that the first electrode a101 overlaps all of the second electrode a102 apart from in the region E below the notch 2. Similarly, the first electrode a101 overlaps all of the field plate a103 apart from in the region E below the notch. Apart from in the region E where the notch 2 is located, the first electrode a101 extends beyond the second electrode a102 and the field plate a103 in all lateral directions, which reduces the electric field strength at the edge of the first and second electrodes a101 and a102.

Figure 5:
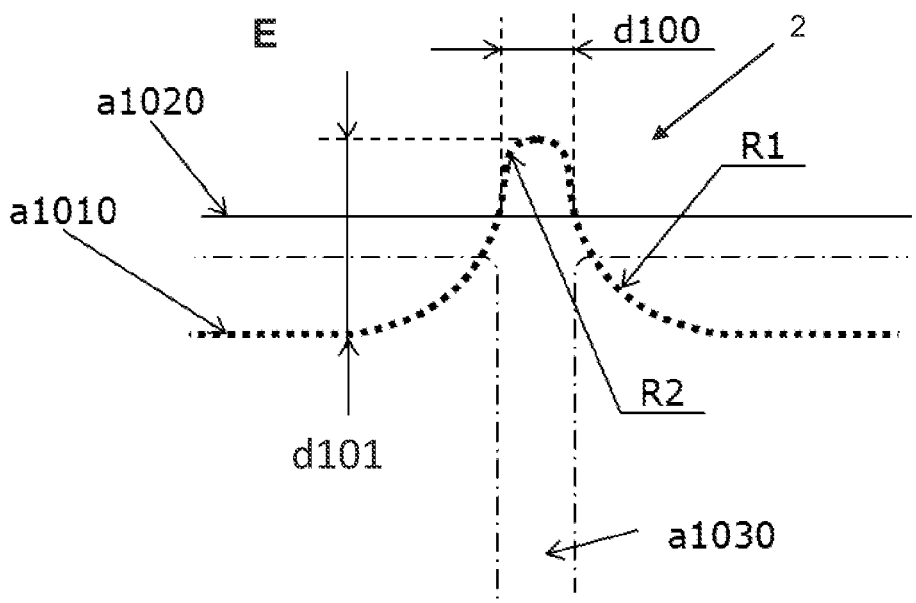
FIG. 5 shows a schematic diagram of a part of a microelectronic device comprising the notch.

FIG. 5 shows a schematic top view of the region E of a microelectronic device in which the notch 2 is located. The notch 2 has a width d100 (typically less than 15 µm), a depth d101 (typically in the range of 5 µm to 20 µm), and a (convex) radius R1 (typically in the range of 5 µm to 20 µm). In this embodiment, the notch 2 also comprises a concave radius R2, which can be derived from the width d100. The rounding with radius R2 is one possibility for the inner termination of the notch. The inner termination is protected against high electric fields by the notch 2, and the actual shape of the inner termination is less important and can be varied.

Figure 6:
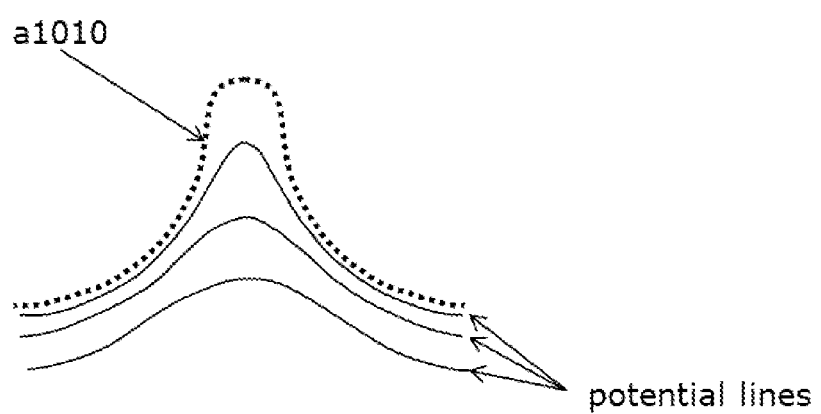
FIG. 6 shows a schematic diagram of the potential field lines around the notch.

FIG. 6 shows a schematic diagram of how the notch 2 influences the local distribution of the electrical potential. The potential lines are pushed out of the notch 2. The distance between the potential lines is thereby significantly increased by the notch. Consequently, the electrical field is decreased in this region. Hence, due to the large relaxation effect of the notch 2 upon the distribution of the potential lines, the connection wire a1030 may not cause a detrimental local increase of the electrical field in this region.

In general, embodiments described herein provide a microelectronic device (e.g. a GI transformer or capacitor) comprising a first electrode and a second electrode located vertically below the first electrode and separated by a dielectric material (e.g. silicon oxide or silicon nitride). The device further comprises a connection wire electrically connected to the second electrode, wherein the first electrode comprises a notch located vertically above the connection wire. In general, the device may comprise a plurality of connection wires with respective overlapping notches in the first electrode. Multiple connection wires may be preferable in devices configured for high currents. The electrodes and the connection wire are typically made of metal such as aluminium or copper to provide the required conductivity.

The microelectronic device is typically a CMOS device, wherein the electrodes and the connection wire are formed in the back-end of line (BEOL) process of the CMOS process. The CMOS process may limit the maximum separation between the electrodes and thereby the height of dielectric material between them. This in turn limits the maximum breakdown voltage of the device. In the present embodiments, the breakdown voltage can be increased by using an electrode comprising a notch located vertically above the connection wire. The first electrode may be configured to operate at a higher voltage than the second electrode.

The notch preferably comprises a concave shape having a width, a depth and a radius, wherein the width may be up to 15 µm, the depth may be in the range of 5 µm to 20 µm, and the radius may be in the range of 5 µm to 20 µm.

The first and second electrodes may be centrally aligned. The first electrode can have a first shape (e.g. substantially circular or rectangular) and the second electrode can have a second smaller shape (e.g. circular or rectangular), such that the first electrode overlaps at least all of the second electrode apart from a region of the second electrode located below the notch. By having the first (upper) electrode extend laterally beyond the second (lower) electrode, the electric field strength can be further reduced at the edges of the electrodes. For example, in the case where the electrodes are substantially circular, the electrodes may be arranged concentrically and vertically displaced. The first (upper) electrode may extend laterally beyond the second electrode on all sides (apart from at the location of the notch). Preferably, the first electrode extends beyond the second electrode in all lateral directions (x, −x, y and −y) by the same distance.

Preferably, the microelectronic device comprises a field plate located vertically below the second electrode and electrically connected to the second electrode, wherein the field plate extends laterally beyond the second electrode. For optimal performance, the field plate should not extend laterally beyond the first electrode (apart from at the location of the notch). Preferably, the first electrode extends beyond the field plate in all lateral directions (x, −x, y and −y) by the same distance. The field plate can further reduce the electric field strength at the edge of the electrodes. The connection wire may be directly connected to and in a same plane as the field plate. The field plate and connection wire may be formed in the same process step by depositing and patterning a metal layer.

The microelectronic device may comprise a contact pad located vertically below the second electrode, and the connection wire may be directly connected to and in a same plane as the contact pad. The contact pad may be directly connected by vias to the field plate (if present) or to the second electrode.

The microelectronic device may be a transformer, wherein the first and second electrodes comprise respective transformer coils. Alternatively the microelectronic device may be a parallel plate capacitor, wherein the first and second electrodes are respective capacitor plates.

Throughout the description and claims positional terms such as 'above', 'below', and 'lateral' are made with reference to standard cross-sectional perspectives as shown in the accompanying drawings. These terms are used for ease of reference and are not intended to limit the invention to devices in that particular orientation.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A microelectronic device comprising:
a first electrode;
a second electrode located vertically below said first electrode and separated by a dielectric material; and
a connection wire electrically connected to said second electrode;
wherein said first electrode comprises a notch located vertically above said connection wire, where said connection wire intersects said first electrode, and wherein said connection wire extends from a side of said first electrode so that at least a part of said connection wire is not covered by said first electrode and said notch.

2. The microelectronic device of claim 1, wherein said notch comprises a concave shape having a width, a depth and a radius.

3. The microelectronic device of claim 2, wherein said width is up to 15 μm.

4. The microelectronic device of claim 2, wherein said depth is in the range of 5 μm to 20 μm.

5. The microelectronic device of claim 2, wherein said radius is in the range of 5 μm to 20 μm.

6. The microelectronic device of claim 1, wherein said first and second electrodes are centrally aligned.

7. The microelectronic device of claim 1, wherein said first electrode has a first shape and said second electrode has a second smaller shape, such that the first electrode overlaps at least all of said second electrode apart from a region of said second electrode located below said notch.

8. The microelectronic device of claim 7, wherein said first shape is circular apart from at the location of said notch.

9. The microelectronic device of claim 8, wherein said second shape is circular, and wherein a diameter of said second shape is smaller than a diameter of said first shape.

10. The microelectronic device of claim 7, wherein said first shape is rectangular apart from at the location of said notch.

11. The microelectronic device of claim 10, wherein said second shape is rectangular, and wherein a width of said second shape is smaller than a width of said first shape.

12. The microelectronic device of claim 1, further comprising a field plate located vertically below said second electrode and electrically connected to said second electrode, wherein said field plate extends laterally beyond said second electrode.

13. The microelectronic device of claim 12, wherein said connection wire is directly connected to and in a same plane as said field plate.

14. The microelectronic device of claim 1, further comprising a contact pad located vertically below said second electrode, wherein said connection wire is directly connected to and in a same plane as said contact pad.

15. The microelectronic device of claim 1, wherein said microelectronic device is a transformer, and said first and second electrodes comprise respective transformer coils.

16. The microelectronic device of claim 1, wherein said microelectronic device is a parallel plate capacitor, and said first and second electrodes are respective capacitor plates.

17. The microelectronic device of claim 1, further comprising a second connection wire electrically connected to said second electrode, and wherein said first electrode comprises a second notch located vertically above said second connection wire.

* * * * *